United States Patent
Kay et al.

(10) Patent No.: US 6,424,690 B1
(45) Date of Patent: Jul. 23, 2002

(54) TWO-THIRDS RATE MODULATION AND CODING SCHEME FOR RAYLEIGH FADING CHANNELS

(75) Inventors: Stanley E. Kay, Rockville; Yezdi Antia, Gaithersburg, both of MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/281,130

(22) Filed: Mar. 29, 1999

(51) Int. Cl.⁷ .............................................. H04L 23/00
(52) U.S. Cl. ......................................... 375/377; 341/50
(58) Field of Search .......................... 341/50; 375/308, 375/377

(56) References Cited

U.S. PATENT DOCUMENTS 5,598,154 A * 1/1997 Wilson et al. ................ 341/50
6,288,655 B1 * 9/2001 Tsang et al. .................. 341/50

* cited by examiner

*Primary Examiner*—Chi Pham
*Assistant Examiner*—Demetria Williams
(74) *Attorney, Agent, or Firm*—John T. Whelan; Michael W. Sales

(57) ABSTRACT

The present invention is a method for generating short, non-systematic, non-linear (6,4) codes that may be implemented in a 4-ARY quadrature-quadrature phase shift keying (QQPSK or $Q^2$PSK) system over GF(16). The codewords are non-systematic in that they do not directly contain the information that is to be transmitted and six symbols are sent to represent four symbols. The present invention uses a code construction method that generates two small, hand-optimized codeword sets and combines those two codeword sets to create two larger codeword sets. The two larger codeword sets are then combined to create a codeword set that is stored in a look-up table for use at a transmission station.

2 Claims, 11 Drawing Sheets

Codeset 128

Codeset 256

TWO-THIRDS RATE MODULATION AND CODING SCHEME FOR RAYLEIGH FADING CHANNELS

BACKGROUND OF THE INVENTION (a) Field of the Invention

The present invention relates generally to coding schemes for communication systems and, more particularly, to a two-thirds rate short block coded modulation scheme for use in Rayleigh fading channels.

(b) Description of Related Art

Digital communication techniques and technology are used in many different applications including satellite and cellular communications systems. One critical aspect of digital communications is a receiver's ability to distinguish one received signal from another. In a digital communication system, symbol separation is one way to prevent confusion between received signals.

Hamming distance and product distance are two well known metrics that are used to measure the separation of communication codewords in a digital communications system. In general, the amount of separation corresponds to the ease with which communication codewords will be confused (i.e., the smaller the separation between two symbols, the more likely it is that the two symbols will be confused). Hamming distance (also referred to as branch diversity) represents the number of symbols that are different between two codewords. For example, the Hamming distance between binary codewords 010 and 101 is three, and the Hamming distance between 010 and 000 is one. The greater the Hamming distance between two codewords, the less likely it is that the two codewords will be confused.

Another useful metric that is considered in digital communications systems is Euclidean distance, which is the measurement of the separation between transmitted codewords as they are modulated onto a carrier. Specifically, Euclidean distance is the measure of the distance between two symbols on the communication codeword bit-map, or constellation. For example, if a carrier phase of 0° represents the codeword 001 and a carrier phase of 180° represents codeword 011, the two codewords have maximum Euclidean distance. Conversely, if the codeword 001 is represented by a phase of 0°, and the codeword 100 is represented by a phase of 45°, the Euclidean distance is a minimum.

Two common communication channel models are the Gaussian channel and the Rayleigh channel. A Gaussian channel is a channel having an additive noise factor. In a Gaussian channel, the power received by a receiver is essentially the power transmitted by a transmitter, reduced by a distance attenuation factor, coupled with a noise power component. When attempting to send information through a Gaussian channel using a phase shift keying technique (e.g., PSK, QPSK, QQPSK) it is useful to maximize the Euclidean distance between codewords to minimize the error probabilities between the transmitted phases.

A Rayleigh communication channel is characterized as a fast fading channel having multipath communication components that interact constructively and destructively to distort the amplitude of the signal received at a receiver. The multipath components cause received power to vary between zero and twice the power transmitted, depending on the type of interference taking place. Because received power can drop out completely in a Rayleigh channel, Euclidean distance is not critical because the underlying principle behind Euclidean distance is the elimination of the confusion between the phases of the various received signals. In a Rayleigh channel, the signal may not even be present. Therefore, the Hamming distance is critical to system operation in a Rayleigh channel. If the Hamming distance between two signals is large, a partial loss of the received signal may not necessarily inhibit the determination of the transmitted codeword.

The Rayleigh channel model is commonly used when designing a mobile communication system such as cellular, wireless or local network system. One known coding scheme that functions in a Rayleigh channel is the trellis code modulation scheme. Trellis coding has three main features. First, trellis coding provides additional points in the communications constellation for redundancy and forward error correction. Second, trellis coding uses convolutional coding to introduce dependency between successive signal points, such that only certain signal patterns are permitted in the system. Third, soft decision coding is performed at the receiver in which the permissible sequence of signals is modeled as a trellis structure. Trellis coding has the disadvantage of being computationally intensive and, therefore, slow and occasionally difficult to implement in systems not having large computational capacity.

SUMMARY OF THE INVENTION

A method of constructing a communication code, including the steps of generating a first set of codewords, generating a second set of codewords, generating a third set of codewords by combining the first set of codewords with the second set of codewords, and generating a fourth set of codewords by combining the first set of codewords with the second set of codewords. The first set of codewords includes 128 hand-optimized codewords and the second set of codewords includes 256 hand-optimized codewords. According to the present invention, the third and fourth sets of codewords include 32768 codewords.

According to the present invention, the step of generating the third set of codewords includes multiplying each codeword in the first set of codewords by a multiplication factor to create a set of multiplied codewords and adding each of the multiplied codewords to each of the second set of codewords. Additionally, the step of generating said fourth set of codewords comprises multiplying each codeword in the second set of codewords by a multiplication factor to create a set of multiplied codewords and adding each of the multiplied codewords to each of the first set of codewords.

The invention itself, together with further objects and attendant advantages, will best be understood by reference to the following detailed description, taken in conjunction with the accompanying drawings.

BRIEF DESCRIPTION OF THE DRAWINGS

Figure 3A:
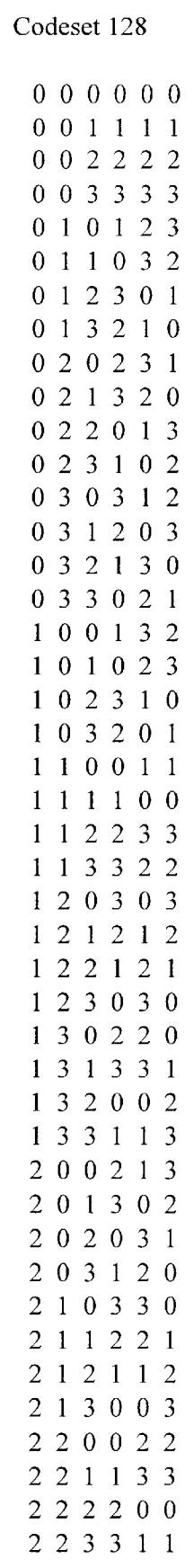
Figure 3B:
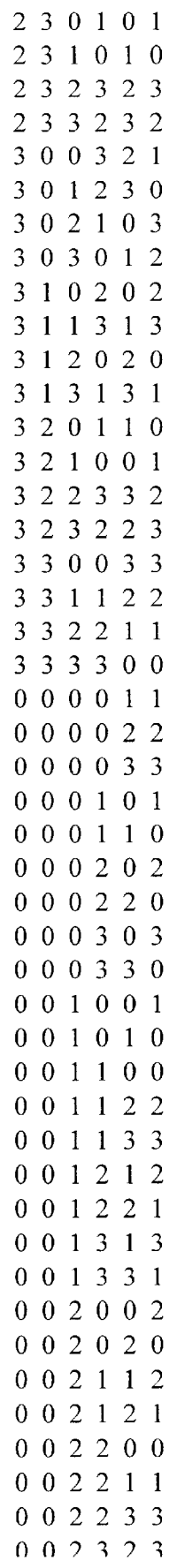
Figure 3C:
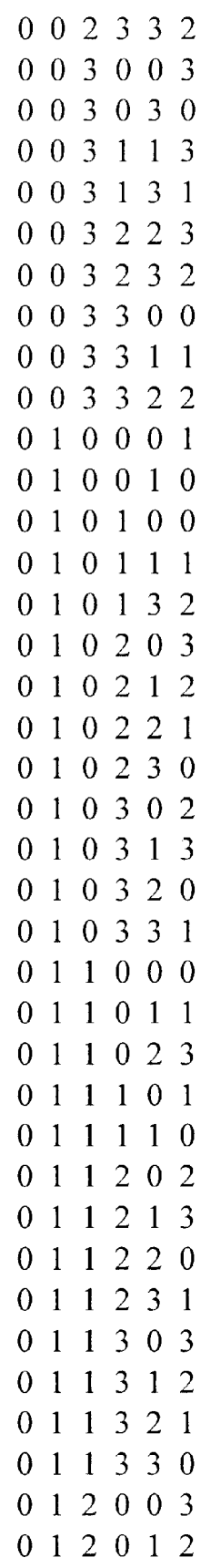

FIGS. 3A–3C together form an example of a hand-optimized set of 128 codewords; and FIGS. 4A–4F together form an example of a hand-optimized set of 256 codewords.

DESCRIPTION OF THE PREFERRED EMBODIMENTS

The present invention is a method for generating short, non-systematic, non-linear (6, 4) codes that may be implemented in a 4-ARY quadrature-quadrature phase shift keying (QQPSK or Q²PSK) system over GF(16). The codewords are non-systematic in that they do not directly contain the information that is to be transmitted, and six symbols are sent to represent four symbols. GF(16) is understood in the art to mean that four bits are transmitted per symbol. As will be apparent to those skilled in the art, each of the four bits may be mapped to any one of the vertices of a four dimensional hypercube that represents a QQPSK modulation scheme constellation. The codes generated in accordance with the present invention are hand-optimized and have reduced complexity and equivalent performance to other block or trellis code schemes. The codeword set consists of $16^4$=65,536 codewords. As will be appreciated by those skilled in the art, hand optimization of 65,536 codewords would be very time consuming. Accordingly, the present invention provides for the generation of 65,536 codewords from smaller sets of codewords that are hand-optimized.

Figure 1:
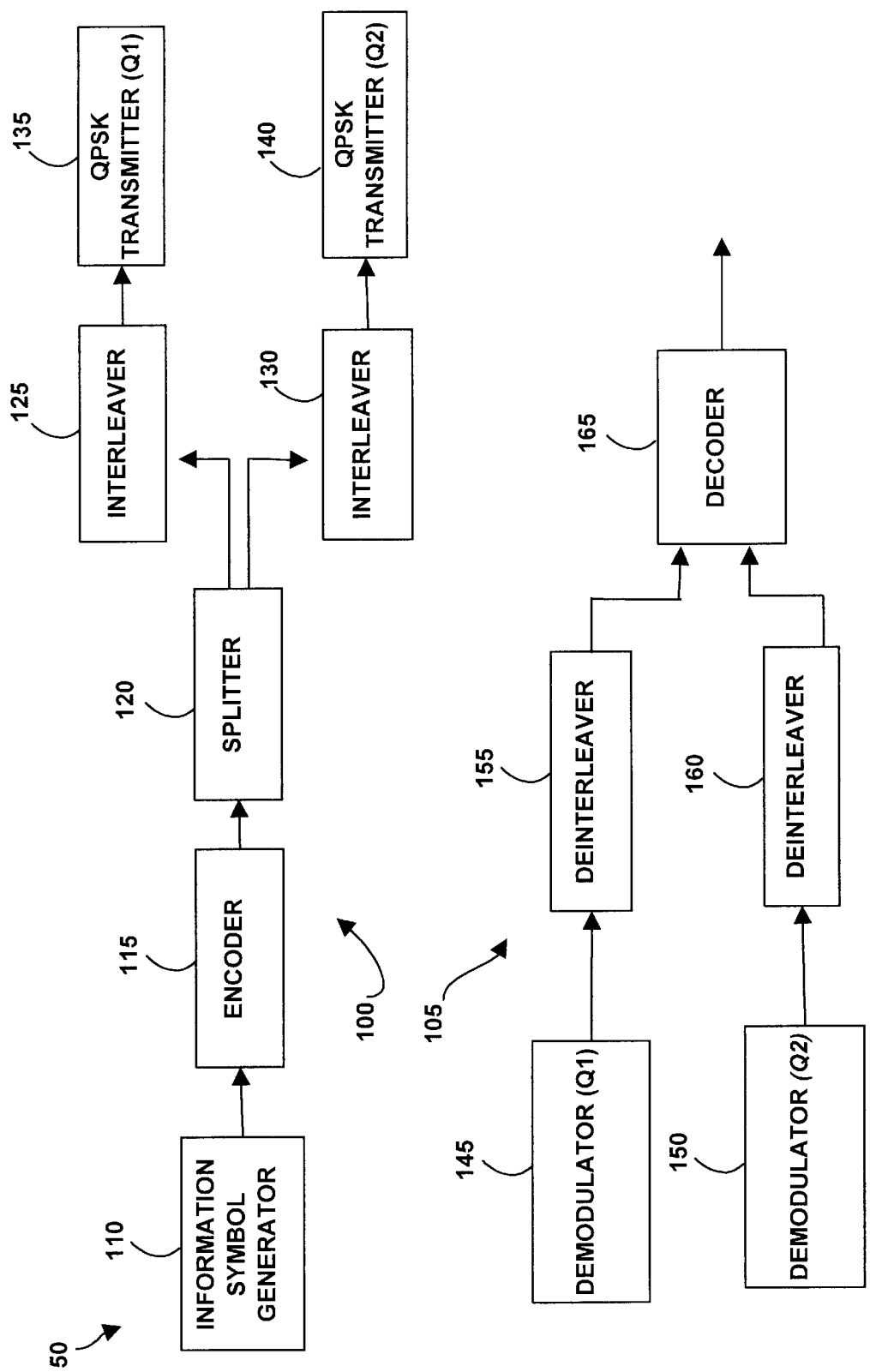
FIG. 1 is a block diagram of a QQPSK system using the present invention.

FIG. 1 is a block diagram of a QQPSK or Q²PSK communication system 50 that may employ the present invention. The functionality described in conjunction with FIG. 1 may be embodied in one or numerous microprocessors or digital signal processors (DSPs). The communication system 50 generally includes a transmission component 100 that includes an information symbol generator 110, an encoder 115, a splitter 120, two interleavers 125, 130 and two QPSK transmitters 135, 140. The communication system 50 also includes a reception component 105 that includes a pair of differential demodulators 145, 150, a pair of deinterleavers 155, 160 and a decoder 165.

During the operation of the transmission component 100, information symbols representative of information to be transmitted are coupled from the information symbol generator 110 to the encoder 115, which uses the information symbols to address a look-up table to find the appropriate codewords that are to be transmitted. The codewords are QQPSK codewords over GF(16). The codewords that are stored in the look-up table are generated in accordance with the method of the present invention.

The encoder 115 passes the GF(16) QQPSK codewords to the splitter 120, which performs the function of splitting the QQPSK, GF(16) codewords into two QPSK codewords over GF(4). The two GF(4) codewords from the splitter 120 are coupled to two interleavers 125, 130. The interleavers interleave the codewords from the splitter among a number of transmission frames. The outputs of the interleavers 125, 130 are coupled to two QPSK transmitters 135, 140. The QPSK transmitters 135, 140 use the signals from the interleavers 125, 130 to modulate carrier waves with the appropriate orthogonal functions to transmit the codewords.

Figure 2:
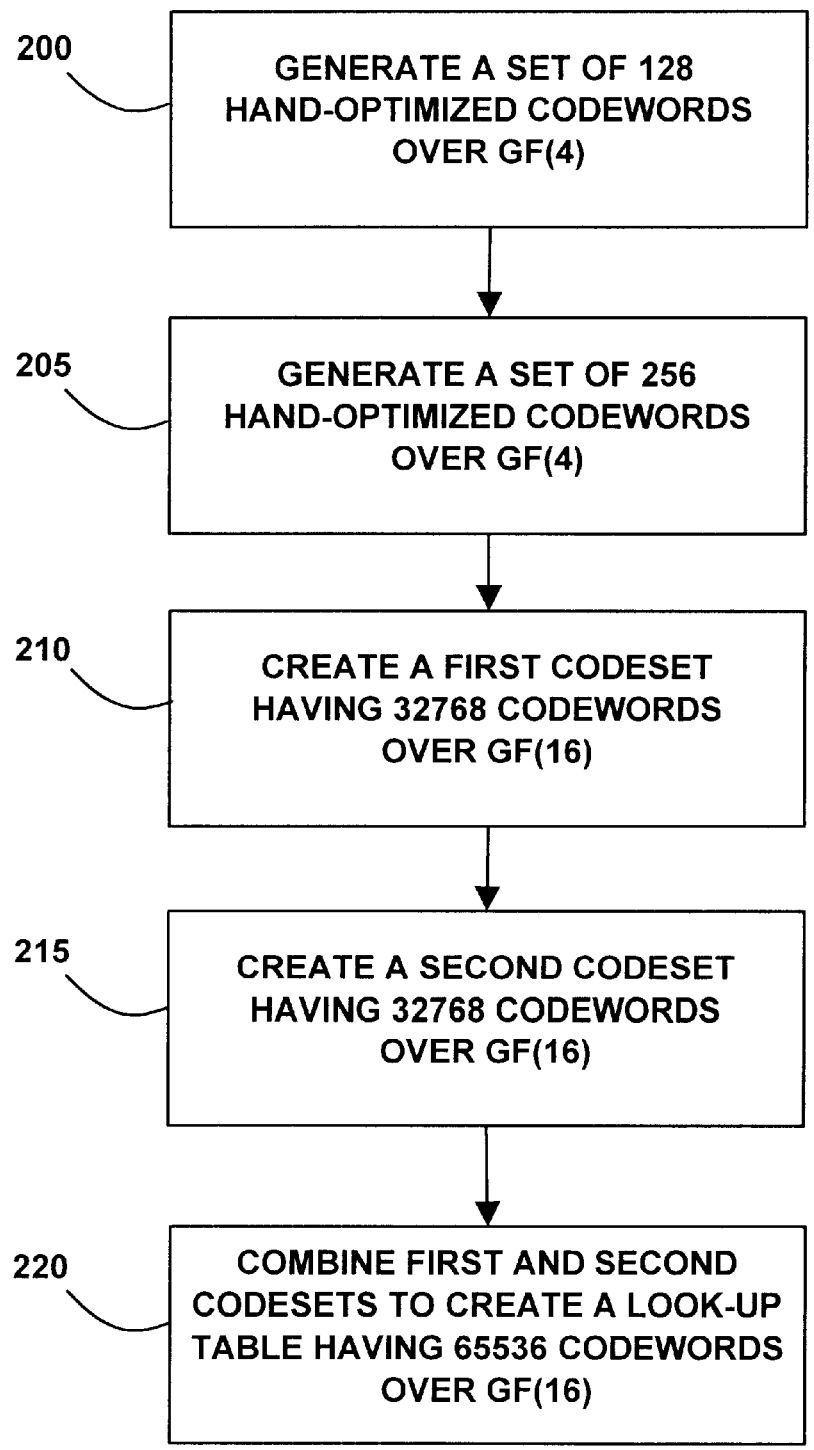
FIG. 2 is a flow diagram for generating codes in accordance with the present invention.

Turning now to FIG. 2, the method used to generate the contents of the look-up table in accordance with the present invention will be described. Generally, the contents of the look-up table are generated using a code construction method that generates two small, hand-optimized codeword sets and then combines those two codeword sets to create two larger codeword sets. The two larger codeword sets are then combined to create the codeword set that is stored in the look-up table of the encoder 115.

Blocks 200 and 205 generate a sets of 128 and 256 hand-optimized, non-linear, non-systematic (6,4) codewords over GF(4), respectively. These codeword sets may be derived by hand or by a computer search program using a Greedy algorithm. Codeword optimization is done considering the channel characteristics of the communications system. For example, in a Rayleigh fading channel the 128 and 256 codeword sets will be selected to optimize communication system performance in a Rayleigh fading channel. In a Rayleigh channel, the probability of error in a communication system may be modeled by equation 1, where $P_E(a,c)$ is the error probability, L' is the Hamming distance, $\Gamma$ is the average signal-to-noise ratio (SNR) and pd is the product distance, which may be represented by equation 2 wherein, $d_0^2(a,c)$ is the Euclidean distance.

$$P_E(a, c) = \frac{1}{pd \cdot \Gamma^L} \qquad \text{Equation 1}$$

$$pd = [d_o^2(a, c)]^L = \left[L\sqrt{\prod_{k=1, d_k^2 \neq 0}^{L} d_k^2(a, c)}\right]^L = \prod_{k=1, d_k^2 \neq 0}^{L} d_k^2(a, c) \qquad \text{Equation 2}$$

For a high SNR, the dominating term of equation 1 is the Hamming distance. However, at low SNR both product distance and Hamming distance or branch diversity become important. As will be appreciated by those skilled in the art, branch diversity is defined as the number of different symbols between two codewords. The sets of 128 and 256 codewords are generated with good Hamming distances and product distances. The Hamming distance or branch diversity among each set of codewords is at least two.

Steps 210 and 215 use the 128 and 256 codeword sets to construct two larger sets of codewords, each having 32768 codewords. For ease of reference, the two larger sets of 32768 codewords will be referred to as codesets 32768_A and $32768_{13}$ B. Codeset $32768_{13}$ A is constructed by multiplying each codeword from the hand-optimized 128 codeword set by a numerical factor and combining that result with all of the codewords from the hand-optimized 256 codeword set. Similarly, codeset 32768_B is constructed by multiplying each codeword from the hand-optimized 256 codeword by a numerical factor and combining that result with all of the codewords from the hand-optimized 128 codeword set. The numerical factor is preferably four and combining is preferably carried out using addition.

For example, consider that (0,0,0,0,0,0) is a member of the hand-optimized 128 codeword set, and (1,0,0,0,0,1) is a member of the hand-optimized 256 codeword set. A member of the codeset 32768_A would be 4*(0,0,0,0,0,0)+(1,0,0,0, 0,1)=(1,0,0,0,0,1). Likewise, a member of the codeset 32768_B would be (0,0,0,0,0,0)+4*(1,0,0,0,0,1)=(4,0,0,0, 0,4). Using this code construction method 65,536 codewords of (6,4) code over GF(16) can be created, wherein each codeword has a minimum Hamming distance of two. After steps 210 and 215 are complete, a step 220 combines the codesets 32768_A and 32768_B into a look-up table that is used by the encoder 115.

Figure 4A:
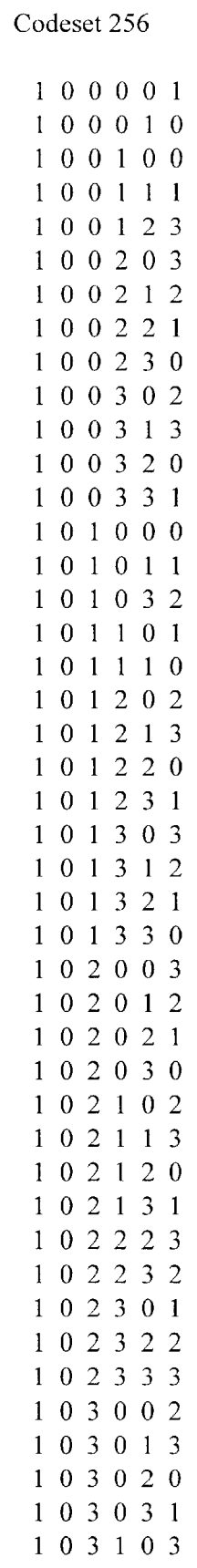
Figure 4B:
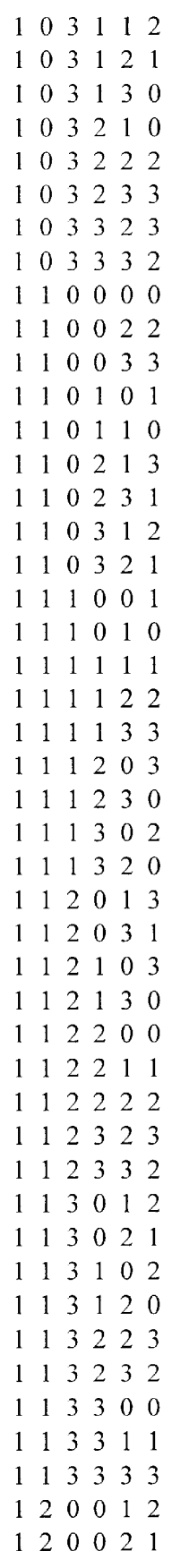
Figure 4C:
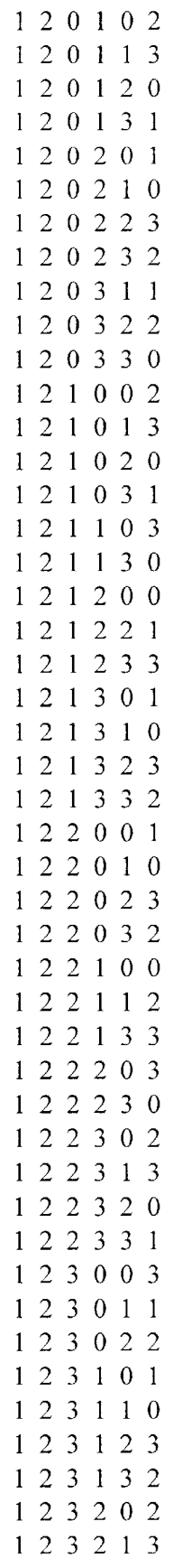
Figure 4D:
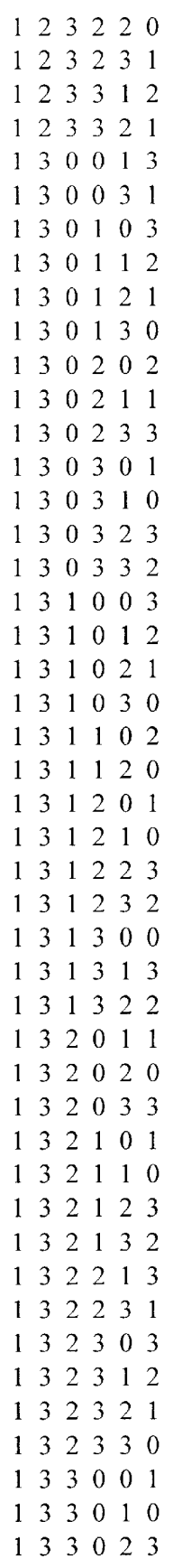
Figure 4E:
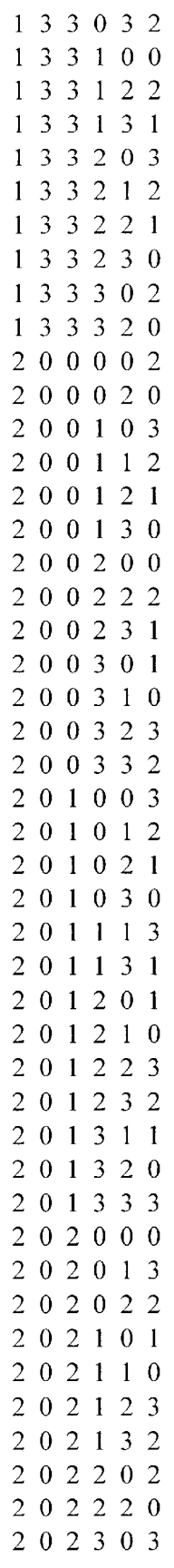
Figure 4F:
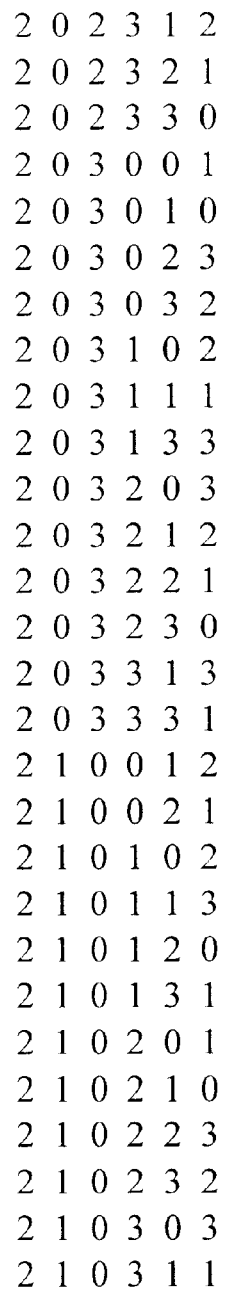

FIGS. 3A–C and 4A–F represent exemplary 128 and 256 codeword sets, respectively. These codeword sets were selected using a Greedy algorithm to optimize code performance in a Rayleigh fading channel. In accordance with the present invention, it is these codeword sets that are combined as described above to generate codesets 32768_A and 32768_B.

Returning now to FIG. 1, the reception component 105 uses the demodulators 145, 150 receive and demodulate the codewords broadcast from the 16-PSK transmitters 135, 140. The demodulators 145, 150 couple the demodulated codewords to the deinterleavers 155, 160. The deinterleavers 155, 160 convert the demodulated codewords from a convolutionally-coded format into a format that was provided to the interleaver 125, 130.

In the decoder 165, each demodulated codeword is compared against all possible codewords from the hand-optimized 128 codeword set. The codeword in the hand-optimized 128 codeword set that is the least distance from the received codeword is selected and noted as 1__128__min and its distance is calculated and noted as 1__128__min. The received codeword is also compared to the hando-ptimized 256 codeword set. The codeword in the hand-optimized 256 codeword set that is the least distance from the received codeword is selected and noted as 1__256__min and its distance is calculated and noted as 1___256__min. This same process is repeated for a second received codeword, which results in terms 2__128__min, 2__128__dmin, 2__256__min, and 2__256__dmin.

The terms from the first and second received codewords are then combined to determine the QQPSK codeword that was transmitted. This combination is performed using equation 3.

$$\text{QQPSK\_code\_dmin} = \text{MIN}(1\_128\_dmin + 2\_256\_dmin,\ 2\_128\_dmin + 1\_256\_dmin) \quad \text{(Equation 3)}$$

Equation 3 indicates that the minimum dista minimum of either: (1) the sum of the distance of the first received codeword to the hand-optimized 128 codeword set and the distance of the second received codeword to the hand-optimized 256 codeword set (referred to hereinafter as the first parenthetical term), or (2) the sum of the distance of the second received codeword to the hand-optimized 128 codeword set and the distance of the first received codeword to the hand-optimized 256 codeword set (referred to hereinafter as the second parenthetical term). Depending on the results of equation 3, the actual codeword transmitted can be obtained by combining 4*2__x__min+1__y__min, where x=256 and y=128, if the first parenthetical term of equation 3 is the minimum distance, or x=128 and y =256, if the second parenthetical term of equation 3 is the minimum distance. The QQPSK codeword is then decoded into the original information symbols that were created by the information symbol generator 110. After decoding is complete, the decoder 165 couples the decoded information, which should be the same as the information generated by the information symbol generator 110, out of the decoder 165 for further processing. Further processing may include digital-to-analog conversion or any other digital processing.

The present invention is a method and apparatus for non-systematic code construction. As disclosed the code may be implemented in QQPSK systems over GF(16). The code provides good performance in Rayleigh fading channels and is computationally efficient and simple to implement.

Of course, it should be understood that a range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of constructing a communication code, the steps comprising:
   a. generating a first set of codewords;
   b. generating a second set of codewords;
   c. generating a third set of codewords by combining said first set of codewords with said second set of codewords, by multiplying each codeword in said first set of codewords by a multiplication factor to create a set of multiplied codewords and adding each of said multiplied codewords to each of said second set of codewords; and
   d. generating a fourth set of codewords by combining said first set of codewords with said second set of codewords.

2. A method of constructing a communication code, the steps comprising:
   a. generating a first set of codewords;
   b. generating a second set of codewords;
   c. generating a third set of codewords by combining said first set of codewords with said second set of codewords; and
   d. generating a fourth set of codewords by combining said first set of codewords with said second set of codewords, by multiplying each codeword in said second set of codewords by a multiplication factor to create a set of multiplied codewords and adding each of said multiplied codewords to each of said first set of codewords.

* * * * *